United States Patent [19]

Smutny

[11] 4,161,724

[45] Jul. 17, 1979

[54] METHOD AND CIRCUIT ARRANGEMENT FOR CONVERTING AN ANALOG QUANTITY INTO A DIGITAL QUANTITY USING A PAIR OF INTEGRATORS

[75] Inventor: Kurt Smutny, Neunkirchen, Fed. Rep. of Germany

[73] Assignee: Siemens Aktiengesellschaft, Munich, Fed. Rep. of Germany

[21] Appl. No.: 794,372

[22] Filed: May 6, 1977

[30] Foreign Application Priority Data

May 12, 1976 [DE] Fed. Rep. of Germany ....... 2621087

[51] Int. Cl.² ............................................ H03K 13/02
[52] U.S. Cl. .......................... 340/347 NT; 324/99 D; 340/347 M; 340/347 CC
[58] Field of Search .... 340/347 NT, 347 M, 347 CC; 235/829; 324/99 D

[56] References Cited

U.S. PATENT DOCUMENTS

| 3,624,643 | 11/1971 | Richman | 340/347 NT |
| 4,024,533 | 5/1977 | Neumann | 340/347 NT |

*Primary Examiner*—Thomas J. Sloyan
*Attorney, Agent, or Firm*—Kenyon & Kenyon

[57] ABSTRACT

An improved method and a circuit arrangement for converting an analog quantity into a digital quantity of the type where the analog quantity is fed to an integrating circuit, to which a reference quantity is temporarily connected during a conversion period and in which the pulses delivered by a pulse generator are also fed to a counter during the time when the reference quantity is connected to the integrating circuit in which during the first phase of a conversion period the analog quantity is fed to a first integrator and, during a second phase immediately following the first phase the analog quantity is fed to a second integrator, with pulses counted in a counter common to both integrators while the reference quantity is connected. Using two integrators permits connecting the analog quantity alternately to each of the integrators and connecting the reference quantity to the respective integrator in the time between, when the analog quantity is not connected. The conversion result obtained in each integrator is referenced to a fixed integration time for the analog quantity. By adding the two conversion results in the common counter, the overall conversion result is also referenced to a fixed integration time.

7 Claims, 3 Drawing Figures

METHOD AND CIRCUIT ARRANGEMENT FOR CONVERTING AN ANALOG QUANTITY INTO A DIGITAL QUANTITY USING A PAIR OF INTEGRATORS

BACKGROUND OF THE INVENTION

This invention relates to analog to digital conversion in general and more particularly to an improved method and a circuit arrangement for converting an analog quantity into a digital quantity, in which the analog quantity is fed to an integrating circuit, to which a reference quantity is temporarily connected during a conversion period and in which the pulses delivered by a pulse generator are also fed to a counter during the time when the reference quantity is connected to the integrating circuit.

A method of the general type is disclosed in German Auslegeschrift No. 1 295 628. It is a disadvantage in this known method that the integration circuit is reset prior to the start of each conversion period by shorting the output to the input and that the analog quantity is disconnected during the resetting time. A change of the analog quantity occurring during this resetting time will therefore be missed and the result of the conversion is accordingly inaccurate.

The same is also true for the known dual slope method of conversion. In this method, the analog quantity is integrated over a given period of time, is then disconnected from the integrator and the reference quantity is connected for integrating down the output signal of the integrator. In this known method, the analog quantity is not sensed during the time that the reference quantity is connected to the integrator.

German Offenlegungsschrift No. 24 39 475 describes a method for converting an analog quantity into a digital quantity, in which the analog quantity is sensed continuously. It is a disadvantage of this method, however, that no constant duration for the converted average value is obtained in the conversion of an analog quantity into a digital quantity. In this known method, one obtains greatly different values for the individual conversion period, so that an average value must again be formed from a multiplicity of conversion periods.

SUMMARY OF THE INVENTION

It is an object of the present invention to provide a method for converting an analog quantity into a digital quantity, in which the analog quantity is sensed continuously and the converted result is referenced to a fixed time interval.

Starting with a method of the kind described at the outset, the solution of the stated problem is possible by providing that during the first phase of a conversion period the analog quantity is fed to a first integrator and, during a second phase immediately following the first phase the analog quantity is fed to a second integrator, with pulses counted in a counter common to both integrators while the reference quantity is connected. Using two integrators permits connecting the analog quantity alternately to each of the integrators and connecting the reference quantity to the respective integrator in the time between, when the analog quantity is not connected. The conversion result obtained in each integrator is referenced to a fixed integration time for the analog quantity. By adding the two conversion results in the common counter, the overall conversion result is also referenced to a fixed integration time.

The accuracy of the method can be further improved by providing that the reference quantity is always disconnected from the respective integrator in synchronism with the zero crossing of the output signal of an integrator and that the residual signal present in this integrator is fed to the other integrator. Since the zero crossing of the output signal of an integrator as a rule does not coincide with a pulse of the pulse generator, quantizing errors arise if the disconnecting is done synchronously with the zero crossing. These quantizing errors are essentially avoided by switching synchronously with the pulses delivered by the pulse generator and taking the residual signal into consideration in the other integrator.

According to a further feature of the present invention, the control means for the method can be substantially simplified by feeding the output signal of the first integrator, in addition to the analog quantity, to the second integrator during the second phase of the conversion period and bringing the input of the first integrator to zero by negative feedback of its output signal, and connecting the reference quantity only to the second integrator during the first phase of the conversion period. In this mode of the method, the output signal of the first integrator is not integrated down by means of the reference quantity but is an input into the second integrator. Thus, the output signal of the second integrator corresponds to the integral of the analog quantity over the full conversion period. Also with this mode of the method, the conversion accuracy can be improved further by providing that the reference quantity is always disconnected synchronously with the pulse following the zero crossing of the output signal of the second integrator and the residual signal present is transferred to the integration process of the next conversion period. The expenditure for components for the method according to the present invention can be kept low by feeding the output signal of the first integrator to an inverting input of the same and to an inverting input of the second integrator, to which the analog quantity is simultaneously fed via a non-inverting input. By using an inverting first integrator, the negative feedback is achieved simply by shorting the output and the inverting input of this integrator.

According to a further feature, the influence of internal errors on the accuracy of the conversion result is eliminated by applying an auxiliary voltage to the integrators for drift compensation. It is particularly advantageous if the auxiliary voltage applied for the drift compension is automatically adjusted so that the output signal of the respective integrator remains constant for a null signal at its input. By automatically adjusting the auxiliary voltage, the effect of internal errors is eliminated even for changing operating conditions for the integrators. The automatic adjustment of the auxiliary voltage is advantageously accomplished by a regulator, to which the rate of change of the output signal of the respective integrator or a quantity proportional to the rate of changes fed as the actual value, with zero fed as the reference value where the reference and the actual values are periodically connected and disconnected to (or from) the regulator during a conversion period with controlled variable remaining effective by means of a memory during the entire conversion period.

A particularly simple circuit arrangement for implementing the method of the present invention includes a first integrator with an inverting input and a second integrator with an inverting and a non-inverting input, a first switching element driven by a timing generator for switching the analog quantity to the inverting input of the first integrator, a second switching element which is controlled by a comparator connected to the output of the second intergrator for connecting and disconnecting the reference quantity to one of the inputs of the second integrator synchronously with the pulses delivered by the pulse generator, in dependence on the polarity of the output signal of the second integrator, third, fourth and fifth switching elements controlled by the timing signal generator for connecting or disconnecting the analog quantity to or from the non inverting input of the second integrator and the output signal of the first integrator to and from its inverting input as well as connecting the output of the first integrator to the inverting input of the second integrator.

DETAILED DESCRIPTION OF THE INVENTION

Figure 1:
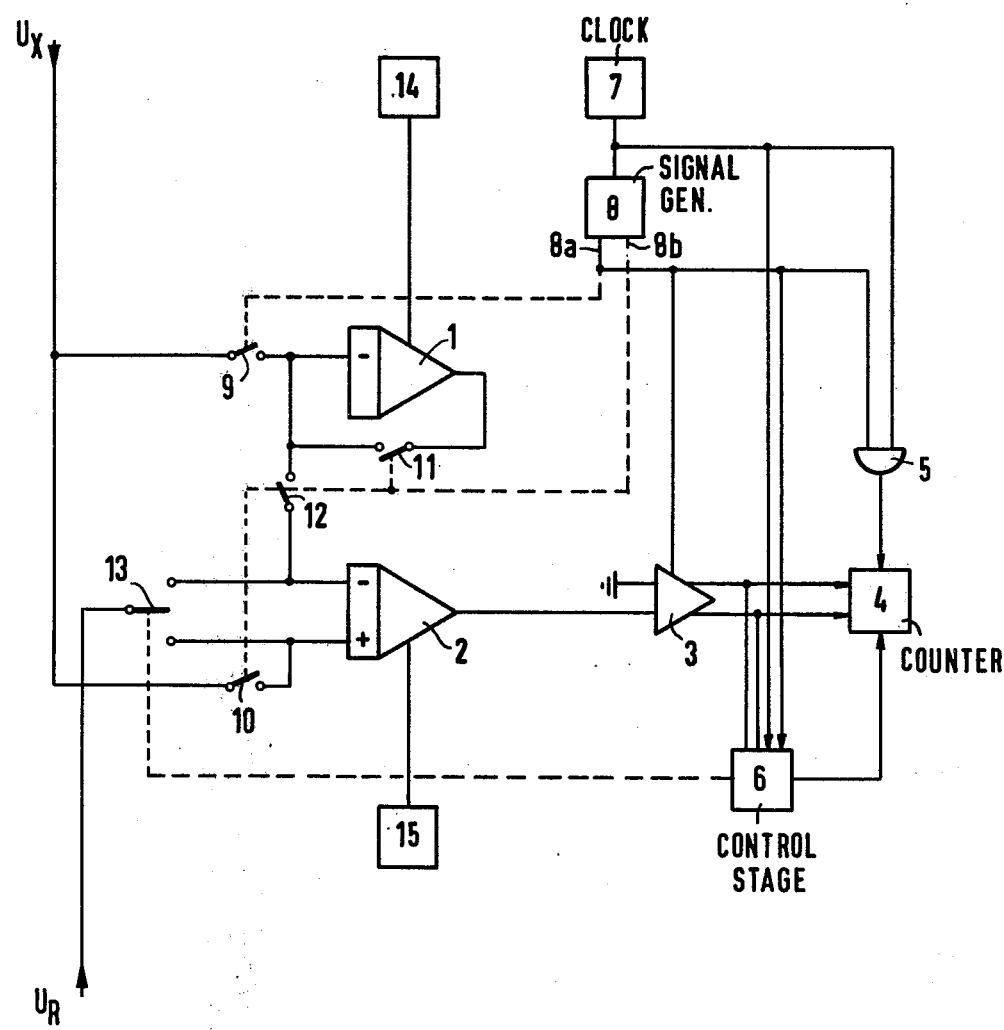
FIG. 1 is a schematic diagram of the circuit of the present invention.

The circuit shown on the FIG. 1 contains a first integrator 1 with an inverting input (−) and a second integrator 2 with an inverting (−) and a non-inverting input (+). A comparator 3 is connected to the output of the second integrator 2. The compararor 3 has two outputs, at one of which a signal appears depending on the polarity of the output signal of the second integrator 2. The two outputs of the comparator 3 are connected to the forward and backward inputs of a counter 4. Depending on which output signal of the comparator 3 is present, the counter 4 is switched to forward or backward counting. The counting input of the counter 4 is connected to an AND gate 5. To the outputs of the comparator 3 are also connected two inputs of a control stage 6 which ascertains the polarity of the output signals of the comparator 3. An output of the control stage 6, which carries signal if the polarity of the comparator output signals changes, is connected to the stop or disable input of the counter 4.

The circuit also includes a pulse generator 7 which is connected to a timing signal generator 8. The timing signal generator 8 has two outputs 8a and 8b. The output 8a carries a signal during a first phase of the conversion period. The total duration of the two phases corresponds to the duration of one conversion period. The output 8a is connected to one input of the AND gate 5. The other input of the AND gate 5 is tied to the output of the pulse generator 7. Thus, pulses can reach the counter 4 during the time when the output 8a of the timing signal transmitter 8 carries a signal.

The output signal of the timing signal generator 8 present at the output 8a actuates a first switching element 9, by which the analog quantity $U_X$ is connected to the inverting input (−) of the first integrator 1. The output signal of the output 8a also enables or starts the comparator 3. The output signal of the output 8b controls third, fourth and fifth switching elements 10, 11 and 12. The analog quantity $U_X$ is connected via the third switching element 10 to the non-inverting input (+) of the second integrator 2. The output of the first integrator 1 is connected via the fourth switching element 11 to the inverting input (−) of the latter and the output of the first integrator 1 is connected via the fifth switching element 12 to the inverting input (−) of the second integrator 2. There is also provided a second switching element 13, which is advantageously designed as a double throw device. This second switching element 13 is controlled by the output signal of the control stage 6 to switch either to the inverting (−) or the non-inverting (+) input of the second integrator 2, depending on the polarity of the output signal of the comparator 3, and thereby apply a reference quantity $U_R$ to the corresponding input of the second integrator 2.

To the first integrator 1 is further connected a control circuit 14 and to the second integrator 2 a control circuit 15. The control circuits 14 and 15 furnish auxiliary voltages for the drift compensation of the two integrators. The switching devices for connecting the control circuits 14 and 15 to the integrators are not shown in the drawing. Such switching devices may already be incorporated in the integrators.

The circuit operates as follows: At first, the output 8a of the timing signal generator 8 carries a control signal. This control signal switches on the first switching element 9 and applies the analog quantity $U_X$ to the inverting input (−) of the first integrator 1. Further, the second switching element 13 is connected, depending on the polarity of the output signal of the second integrator 2, to the inverting (−) or the non-inverting input (+) of the second integrator 2. Thus, the reference quantity $U_R$ is applied to the corresponding input of the second integrator 2. The control signal at the output 8a of the timing signal generator 8, enables the pulses of the pulse generator 7 to be passed through the AND gate 5 to the counter 4. By means of the output signal of the comparator 3, the counter 4 is switched either to forward or to backward counting.

After the first switching element 9 is switched on, the analog quantity $U_X$ is integrated in the first integrator 1. With the application of the reference quantity $U_R$ to the second integrator 2, the output signal begins to be integrated down in this integrator. Simultaneously with the application of the reference quantity $U_R$ to the second integrator 2, the counter 4 has been started by the control signal at the output 8a of the timing signal generator 8. As soon as the output signal of the second integrator 2 is integrated down to zero, the polarity of the output signal of the comparator 3 is reversed in synchronism with the next pulse of the pulse generator 7. Such a reversal of the polarity results in an output signal from the control stage 6, whereby the counter 4 is stopped. The count reached is therefore a measure for the analog quantity. Simultaneously with the stopping of the counter 4, the reference quantity $U_R$ is also disconnected again via the control stage 6 from the input of the main integrator 2. Since the counter 4 is not stopped immediately when the output signal of the main integrator 2 becomes zero, but only with the pulse following the null, a residual signal remains at the output of the second integrator 2. To avoid inaccuracies, this residual signal is included in the next integration process.

After a certain time, the control signal at the output 8a of the timing signal generator 8 disappears, whereby the first phase of the conversion period is terminated. Immediately thereafter, a control signal appears at the output 8b, whereby the second phase of the conversion period is started. With the disappearance of the control signal at the output 8a, the first switching element 9 is opened and thereby, the analog quantity $U_X$ is disconnected from the first integrator 1. The control signal at the output 8b causes the third switching element 10 is closed and the analog quantity $U_X$ is connected to the non-inverting input (+) of the second integrator 2. In addition, the output of the first integrator 1 is negatively fed back via the fourth switching element 11 to the inverting input of the former and the output signal of the first integrator 1 is applied via the fifth switching element 12 to the non-inverting input (−) of the second integrator. The control of the third, fourth and fifth switching element 10, 11 and 12 by the timing signal generator 8 is indicated by a dashed line between these switching elements and the output 8b of the timing signal generator 8. During the second phase of a conversion period, the analog quantity $U_X$ is integrated up by the second integrator 2. At the same time, the second integrator 2 receives the value of the analog quantity $U_X$ integrated up by the first integrator 1 in the first phase of the conversion period.

At the end of the second phase, the output signal of the second integrator 2 corresponds to the integral of the analog quantity $U_X$ over a full conversion period. At the end of the second phase, the control signal 8b of the timing signal generator 8 disappears and the third, fourth and fifth switching elements 10, 11 and 12 are opened again. At the same time, a control signal appears again at the output 8a, whereby the first phase of the next conversion period is initiated again.

Integrator 2 must deliver an output which is equal to the integral of the difference at the input. Thus the rate of change of the output equals the difference between the input signals. The integrator may be constructed using commercially available operational amplifiers.

The signal generator can simply be a digital counter which divides down the clock pulses from the pulse generator 7 to develop the two phase outputs. Typically these can come from the last stage of the counter, one phase being provided by the Q output thereof and the other phase by the Q output thereof.

Figure 2:
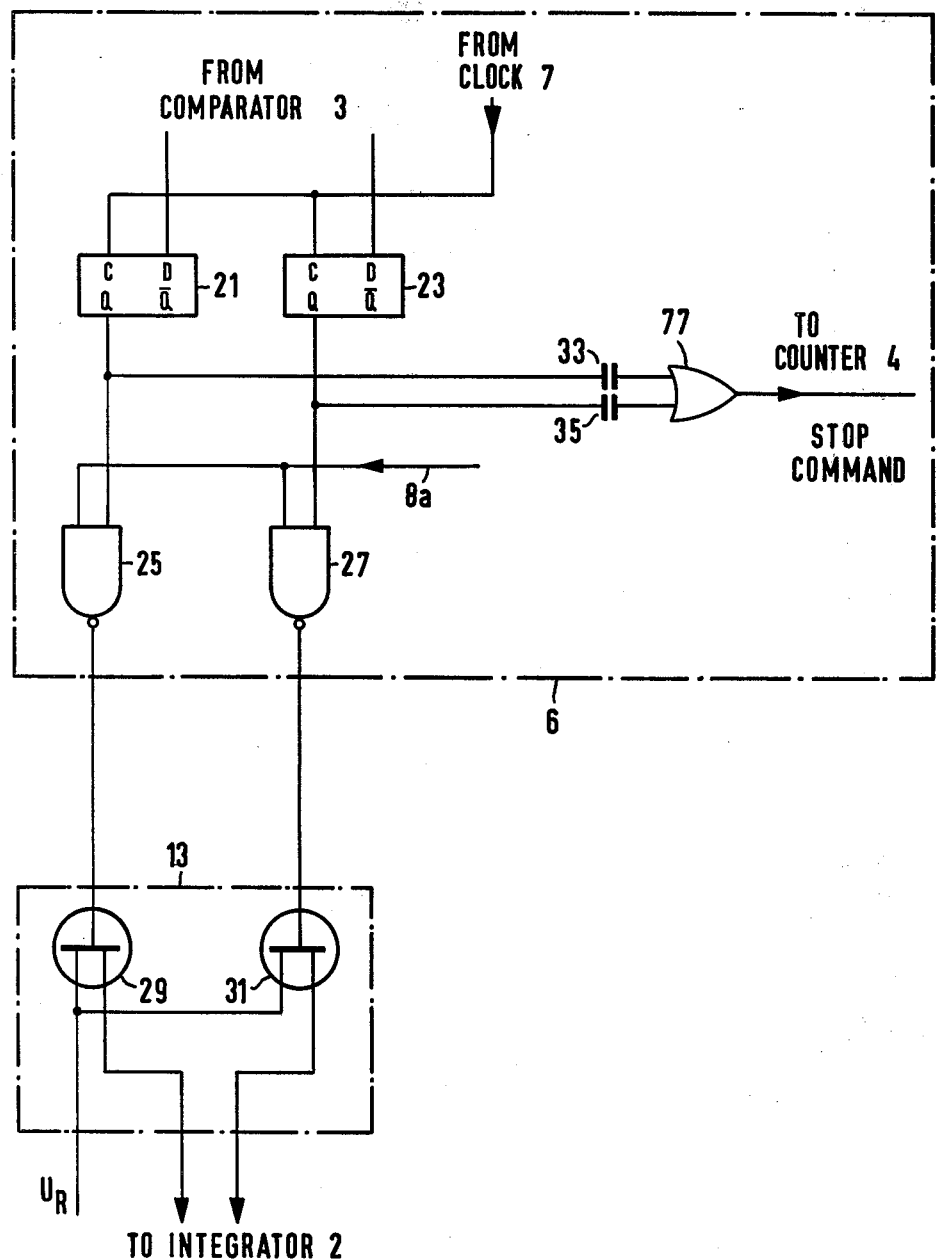
FIG. 2 is a logic diagram of the control stage of FIG. 1.

FIG. 2 illustrates a possible implementation of the control stage 6 of FIG. 1. The two outputs from the comparator 3 are provided to D-type flip-flops 21 and 23. The clock inputs of the D flip-flops 21 and 23 are fed from the clock 7. Thus, when a comparator output changes, on the next clock pulse, that change will be transferred to the Q output of the respective D-type flip-flop. Since it is only desired that the switch 13 operate during the first phase, the respective outputs of the flip-flops 21 and 23 are coupled through NAND gates 25 and 27 which obtain an enabling input from the first phase signal on line 8a. As illustrated, the switch 13 may comprise a pair of FET switches 29 and 31 having their gates coupled to the outputs of the NAND gates 25 and 27, their sources coupled to the reference voltage $U_R$ and their drains coupled to the respective inputs of the integrator 2. In order to develop the stop command for the counter 4, the outputs of the flip-flops 21 and 23 are differentiated through capacitors 33 and 35 respectively and coupled through an OR gate 37. Thus, every time there is a zero crossover transition, on the next clock pulse when this transition becomes felt at the output of one of the flip-flops 21 or 23, a stop command will be supplied to the counter 4.

Through the use of a first integrator 1 and a second integrator 2 in the method according to the present invention, the possibility exists to integrate the analog quantity $U_X$ continuously and still to carry out drift compenstion at the integrators. This is possible because there is a time interval for each of the integrators in one of the two phases, when the integrator in question is not in operation. This is the case for the first integrator 1 during the second phase of a conversion period after the input becomes zero due to the negative feedback of the output signal, and for the second integrator 2 during the first phase of a conversion period after the output signal has been integrated downward. During the interval when the integrator in question is not in operation, the rate of change of its output signal or a quantity proportional to the rate of change in measured at its output. In accordance with this measured quantity, an auxiliary voltage is set in the respective control circuit 14 or 15, which is then fed during the time that the respective integrator 1 or 2 is in operation, to the latter as a constant value. Thereby, the drift error of the respective integrator is corrected during the up as well as the down integration and thus, a high accuracy of the conversion result is obtained. By the ever repeated measuring of the rate of change of the output signal, a possible change of the drift error due to any influence is picked up immediately and the auxiliary voltage is set accordingly.

Figure 3:
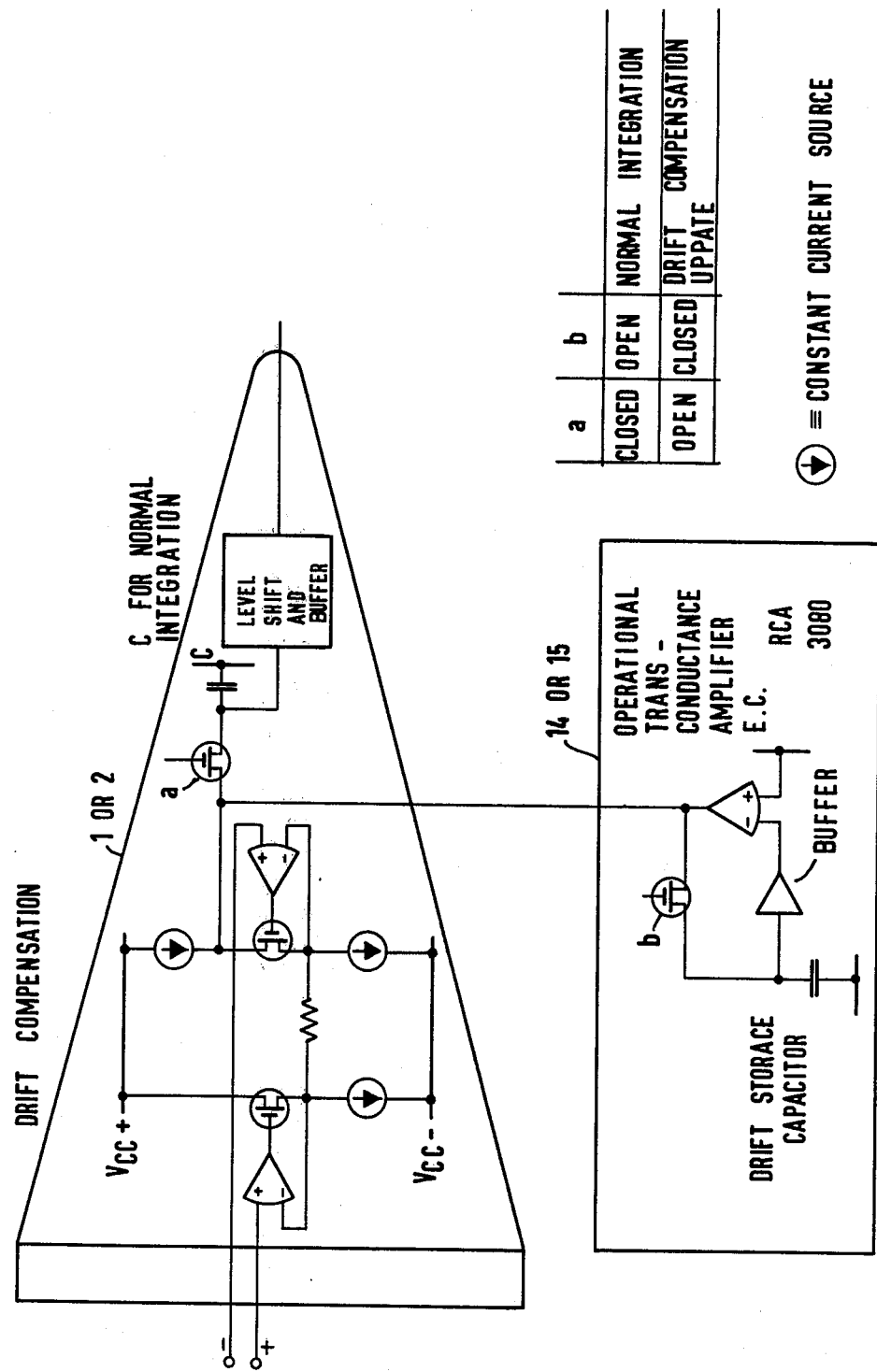
FIG. 3 is a more detailed circuit diagram of the integrators and drift compensation of FIG. 1.

FIG. 3 illustrates in more detail the circuit of the amplifiers 1 and 2 and the drift compensation 14 and 15 of FIG. 1. As illustrated, in each amplifier 1 and 2, the inverting input is coupled to the non-inverting input of an amplifier 101, and the non-inverting input to the non-inverting input of an amplifier 103. The output of amplifier 101 is coupled to the gate of an FET 105, and the output of amplifier 103 to the gate of an FET 107. The source of the FET 107 is coupled to the positive voltage supply and its drain is coupled to a constant current source 109, which in turn is coupled to the negative supply voltage. The source of FET 105 is coupled to a constant current source 111 fed by the positive supply voltage and the drain of FET 105 to a constant current source 113, coupled to the negative supply voltage. The inverting input of amplifier 101 is coupled to the drain of FET 105. Similarly, the inverting input of amplifier 103 is coupled to the drain of FET 107. The two drains are coupled together by a resistor 115. At the junction of the constant current source 111 and the source of FET 105 a lead is taken to the source of an FET 117a. The drain of FET 117a is coupled to one side of a capacitor C, the other side of which is grounded. The drain of the FET 117a is also coupled to a level shift and buffer module 19 which provides the overall output of the integrator. The drift compensation circuit includes an amplifier 121 having its non-inverting input grounded and its inverting input coupled to one side of a drift storage capacitor 123 through a buffer 125. The output of amplifier 121 is coupled through an FET 117b to the capacitor 123, the other side of the capacitor being grounded. The output of amplifier 121 couples to the source of the FET 117a. At the right hand side of the figure is a chart showing the manner in which the FET switches 117a and 117b are operated. Normally, switch 117a is closed and integration proceeds. During this time, the drift storage capacitor through the buffer 125 and amplifier 121 will be providing a drift compensation. When it is desired to update the drift compensation, the switch 117b is closed and the switch 117a opened.

What is claimed is:

1. In a method for converting an analog quantity into a digital quantity, in which the analog quantity is temporarily connected during a conversion period and in which, further, pulses delivered by a pulse generator are fed to a counter during a time when the reference quantity is connected to the integrating circuit, the improvement comprising repetitively carrying out the following steps:

(a) feeding the analog quantity to a first integrator during the first phase of a conversion period;

(b) feeding the analog quantity to a second integrator during a second phase of the conversion period immediately following the first phase;

(c) feeding the output signal of the first integrator to the second integrator in addition to the analog quantity and bringing the input of the first integrator to 0 by negative feedback of its output signal during said second phase of the conversion period;

(d) connecting the reference quantity to the second integrator only during the first phase of the conversion period for a time period sufficient to bring said second integrator to zero during said first phase; and (e) counting the pulses in a counter over said time when said reference quantity is connected to said second integrator, whereby during the second phase of the conversion period the second integrator will at the same time integrate the output signal and have transferred to it the signal integrated by the first integrator during the first conversion period, so that, after the second repetition of the first phase of the conversion period, the output obtained by connecting the reference quantity to the second integrator and counting pulses in a counter will be a true representation of the analog quantity.

2. The method according to claim 1, wherein said reference quantity is always disconnected synchronously with the pulse following the zero crossing of the output signal of the second integrator and the residual signal is tranferred to the integration process of the next conversion period.

3. The method according to claim 1, wherein the output signal of the first integrator is fed to an inverting input of said first integrator and to an inverting input of the second integrator, to which the analog quantity is simultaneously fed via a non inverting input.

4. The method according to claim 1, and further including applying an auxiliary voltage for drift compensation to the integrators.

5. The method according to claim 4, wherein the auxiliary voltage applied for the purpose of drift compensation is automatically set so that the output signal of the respective integrator remains constant if the signal at its input is zero.

6. The method according to claim 5, and further including automatically adjusting said auxiliary voltage by a regulator, having as an actual value input the rate of change of the output signal of the respective integrator or a quantity proportional to the rate of change and zero as a reference value input and periodically connecting and disconnecting the reference and the actual value to or from the regulator and maintaining the controlled variable effective during the entire conversion period by means of memory.

7. A circuit for converting an analog voltage to a digital signal comprising:

(a) a first integrator with an inverting input;

(b) a second integrator with an inverting and a non-inverting input;

(c) a pulse generator;

(d) a timing generator obtaining an input from said pulse generator and having a first phase output and a second phase output;

(e) a first switching element driven by the first phase output of said timing generator for switching the analog voltage to the inverting input of the first integrator;

(f) a comparator having an input connected to the output of said second integrator and having first and second outputs one of which will be present in dependence on the polarity of the output signal of the second integrator;

(g) a second switching element which is controlled by said comparator synchronously with the pulses delivered by the pulse generator switching a reference voltage to the non inverting input of said second integrator in response to said first comparator output signal and switching said reference voltage to the inverting input of said second integrator in response to said second comparator output when said first phase output is present;

(h) third, fourth and fifth switching elements controlled by the second phase output of said timing signal generator to respectively connect said analog voltage to the non inverting input of said second integrator and, the output signal of said first integrator to its inverting input, the output signal of said first integrator to the inverting input of the second integrator; and (i) a counter having a count input coupled to said pulse generator, an enabling input coupled to said first phase output, a stop input responsive to a change at the output of said comparator and a direction input responsive to said first and second comparator outputs, whereby during the time of said second phase output, said second integrator will at the same time integrate the output signal and have transferred to it the signal integrated by the first integrator during said first phase output, so that, after the second repetition of the first phase output, the output obtained by connecting the reference quantity to the second integrator and counting pulses in said counter will be a true representation of the analog quantity.

* * * * *